(12) United States Patent
Cheng et al.

(10) Patent No.: US 9,938,138 B2
(45) Date of Patent: Apr. 10, 2018

(54) MEMS DEVICE STRUCTURE WITH A CAPPING STRUCTURE

(71) Applicant: Taiwan Semiconductor Manufacturing Company, Ltd., Hsin-Chu (TW)

(72) Inventors: Chun-Wen Cheng, Zhubei (TW); Chia-Hua Chu, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/436,943

(22) Filed: Feb. 20, 2017

(65) Prior Publication Data
US 2017/0158494 A1 Jun. 8, 2017

Related U.S. Application Data

(63) Continuation of application No. 13/925,127, filed on Jun. 24, 2013, now Pat. No. 9,573,806.

(60) Provisional application No. 61/775,931, filed on Mar. 11, 2013.

(51) Int. Cl.
*B81C 1/00* (2006.01)
*B81B 7/00* (2006.01)

(52) U.S. Cl.
CPC .......... *B81C 1/00158* (2013.01); *B81B 7/008* (2013.01); *B81B 2207/015* (2013.01); *B81B 2207/096* (2013.01); *B81C 2201/0109* (2013.01); *B81C 2201/0132* (2013.01); *B81C 2203/0118* (2013.01); *B81C 2203/0742* (2013.01)

(58) Field of Classification Search
CPC .... B81C 2203/0127; B81C 2203/0145; B81C 2203/0714; B81C 2203/07; B81C 2203/0785
See application file for complete search history.

(56) References Cited

U.S. PATENT DOCUMENTS

2011/0316101 A1* 12/2011 Dang .................. B81C 1/00476
257/418
2012/0043627 A1 2/2012 Lin et al.
2014/0264475 A1 9/2014 Cheng et al.

FOREIGN PATENT DOCUMENTS

CN 102295264 12/2011

* cited by examiner

*Primary Examiner* — Jae Lee
(74) *Attorney, Agent, or Firm* — Haynes and Boone, LLP

(57) ABSTRACT

An integrated circuit device includes a dielectric layer disposed over a semiconductor substrate, the dielectric layer having a sacrificial cavity formed therein, a membrane layer formed onto the dielectric layer, and a capping structure formed on the membrane layer such that a second cavity is formed, the second cavity being connected to the sacrificial cavity through a via formed into the membrane layer.

20 Claims, 6 Drawing Sheets

MEMS DEVICE STRUCTURE WITH A CAPPING STRUCTURE

PRIORITY DATA

The present application is a continuation application of U.S. patent application Ser. No. 13/925,127, filed Jun. 24, 2013, which claims priority to U.S. Provisional Application No. 61/775,931 entitled "MEMS Device Structure with a Capping Structure" filed Mar. 11, 2013, each of which is incorporated herein by reference in its entirety.

BACKGROUND

A micro-electromechanical system (MEMS) device may have components within the micrometer size range and sometimes within the nanometer size range. A typical MEMS device may include processing, analog, or logic circuitry as well as mechanical components for various types of sensors. These sensors may be used as part of a Radio Frequency (RF) switch, gyroscope, accelerometer, or motion sensor.

The mechanical components of MEMS devices are often provided in chambers, in which the components are allowed to move. Often there are two chambers connected through one or more vias. One way to form such chambers is to use a sacrificial material. Specifically, a cavity is formed into a particular layer. That cavity is then filled with a sacrificial material. Subsequent layers may then be deposited on top of the sacrificial material. A via is then formed through the subsequent layers to expose the sacrificial material. The sacrificial material can then be released through various chemical processes. While this is an effective way to form chambers, it is desirable to minimize the number of sacrificial layers when fabricating MEMS devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
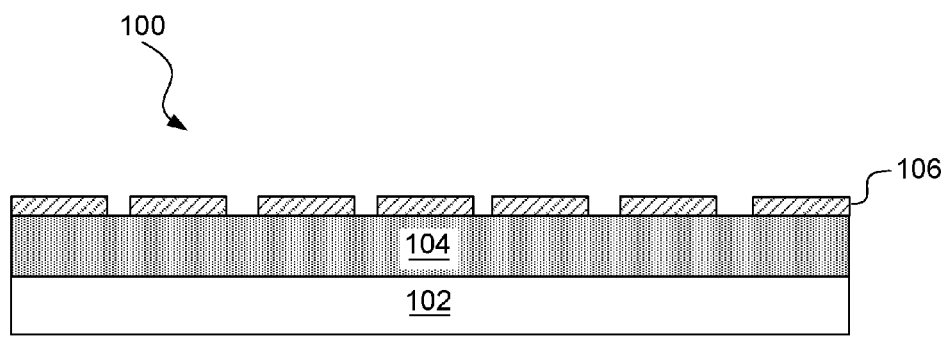
FIGS. 1A-1H are diagrams showing an illustrative process for forming a MEMS device structure that includes a capping structure, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1H are diagrams showing an illustrative process for forming a MEMS device structure that includes a capping structure. According to the present examples, the MEMS device structure is built onto a Complementary Metal-Oxide Semiconductor (CMOS) substrate 104. In the present example, the CMOS substrate 102 is formed onto a high resistive substrate 102. A high resistive substrate may be one that is at least 1000 ohms-cm.

The CMOS substrate 104 is made of a semiconductor material such as silicon. The CMOS substrate may include circuitry that is used to operate or interact with a MEMS device formed within the MEMS device structure. This circuitry (not shown) may be formed in multiple layers of metal, semiconductor, and dielectric material.

According to the present example, a metal layer 106 is formed on top of the CMOS substrate 104. The metal layer acts as a bottom electrode layer for a sacrificial cavity to be formed as will be described further below. The metal layer 106 may be part of the CMOS substrate. The various metal contacts of the metal layer 106 may be connected to metal contacts of an underlying CMOS substrate metal layer through a number of vias. The metal layer 106 may be formed by depositing a metal layer, patterning that layer, and then removing regions of metal where there is to be no metal.

Figure 1B:
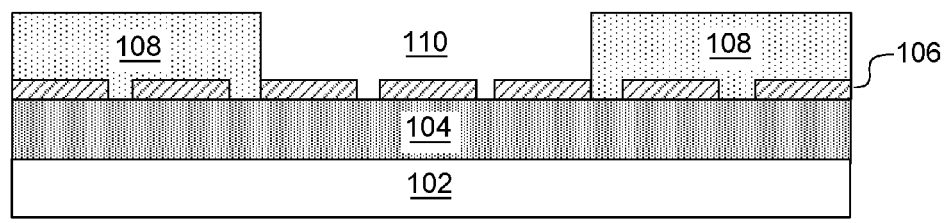

FIG. 1B illustrates the formation of an interlayer dielectric layer 108 on top of the metal layer 106. The interlayer dielectric layer 108 exists between two electrode layers. The inter-layer dielectric layer 108 may be made of an oxide material. A Chemical-Mechanical Polishing (CMP) process may be used to smooth out the inter-layer dielectric layer 108. A mask may then be used to pattern a cavity region 110 within the interlayer dielectric layer 108. An etching process may be used to remove material from the dielectric layer to expose the underlying bottom electrode metal layer 106 and form the cavity 110.

Figure 1C:
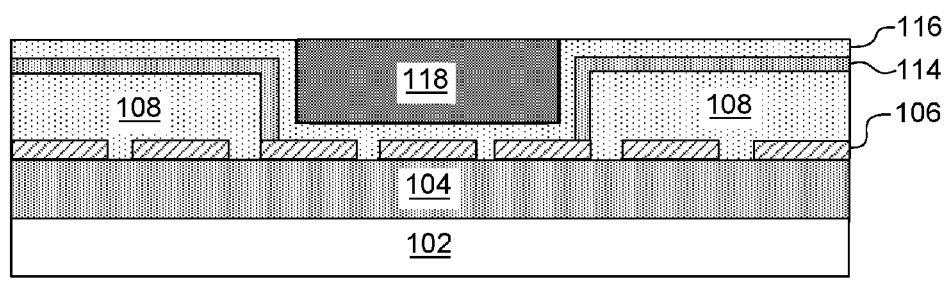

FIG. 1C illustrates the deposition of additional dielectric layers. For example, an oxide layer 114 may be formed on top of the inter-layer dielectric layer 108. In some cases, this oxide layer 114 may be patterned such that oxide bumps (not shown) remain on top of some of the metal contacts of the metal layer 108. Additionally, a thin dielectric material 116 may be deposited on top of the oxide layer 114.

According to the present example, the sacrificial cavity 110 is filled with a sacrificial material 118 such as amorphous silicon (a-Si), a non-crystalline allotropic form of silicon. The sacrificial material 118 is selected so that it can be removed through a dry etching process as will be described further below. After the sacrificial material 118 has been deposited, a CMP process may be used to smooth out the surface.

Figure 1D:
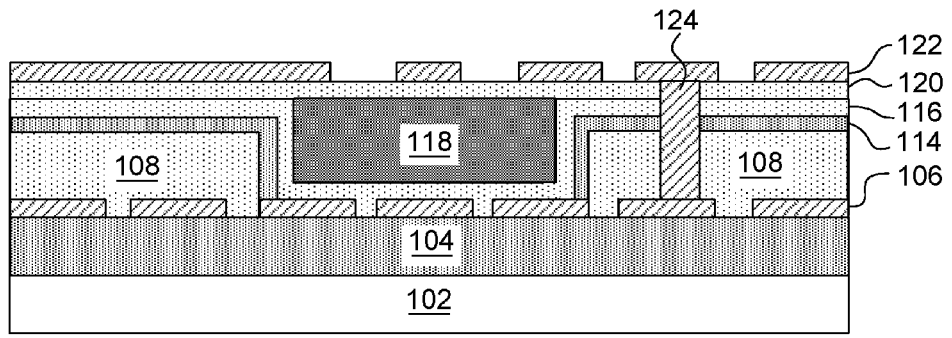

FIG. 1D illustrates the deposition of an additional thin dielectric film 120 on top of the dielectric layer 116 and the sacrificial material 118. Both the first thin dielectric layer 116 and the second dielectric layer 120 may be made from the same material. The dielectric layers isolate the lower layers from any additional layers that are later formed.

According to the present example, a via 124 is formed into the deposited layers. Specifically, the via 124 may be formed through the thin dielectric layer 116, 120, the oxide layer 114, the interlayer dielectric layer 108 and stop at the top electrode metal layer 106. A top electrode metal layer 122 may then be formed on top of the thin dielectric layer 120. When depositing the metal material, the via 124 is filled so that the top electrode metal layer 122 and the bottom electrode metal layer 106 are electrically connected. While one via 124 is illustrated, it may be the case that multiple vias are used to connect metal components of the top electrode metal layer 122 with metal components of the bottom electrode metal layer 106.

The top electrode metal layer 122 may be formed in a manner similar to that of the bottom electrode metal layer 108. Specifically, a metal or conductive material is deposited onto the previous layer. The metal layer 122 can then be patterned using a mask. An etching process is then used to remove metal from the regions where metal is not intended to be used. In some examples, a particular metal contact may extend over the sacrificial material 118. This allows metal features to be formed between the sacrificial cavity and a second cavity that will be described in further detail below.

Figure 1E:
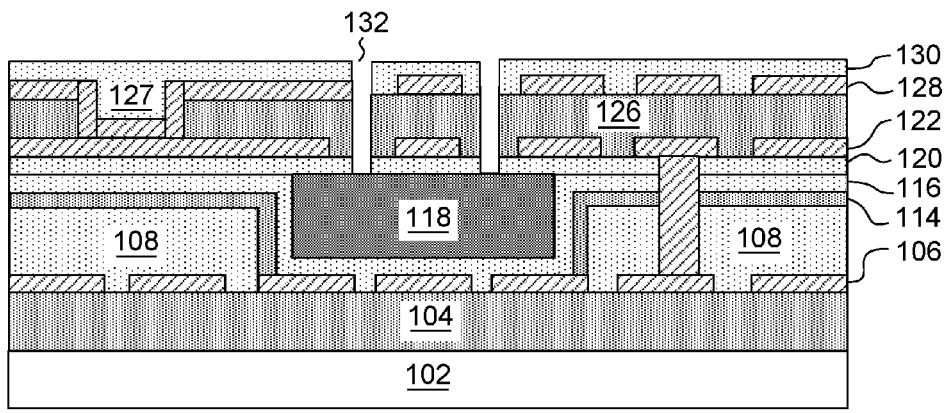

FIG. 1E illustrates the formation of a membrane layer 126. The membrane layer is an additional dielectric layer. It will be referred to as a membrane layer to distinguish it from the first inter-layer dielectric layer 108. Moreover, the membrane layer may be used as an RF switch membrane. The membrane layer 126 provides mechanical strength and rigidity to act as a flexible suspended membrane or beam for a movable structure of the MEMS device. In some examples, the membrane layer 126 has a thickness within a range from about 0.5 micrometers to 5 micrometers.

The membrane layer 126 may include a number of vias 127. The vias 127 may be performed through standard photolithographic techniques such as using a photo-mask to expose a photo-resist layer to a light source. The photo-resist layer is then developed away and the remaining regions of photo-resist material are used to define the vias 127. An etching process may then be used to form the vias through the membrane layer 126 down to the underlying top electrode metal layer 122.

According to the present example, a third metal layer 128 is formed onto the membrane layer 126. The third metal layer may connect with the top electrode metal layer 122 where the vias 127 have been formed. The third metal layer 128 may also be formed by depositing the metal material, patterning the metal layer, and then etching away regions where metal is not intended to be formed.

A top dielectric layer 130 is then deposited onto the third metal layer 128. The top dielectric layer may be used for stress balance. The top dielectric 130 layer may be made of an oxide material. In some examples, portions of the top dielectric layer may be removed to expose an underlying metal component. This may be used for various MEMS devices such as an RF switch structure.

After the top dielectric layer 130 has been formed, a number of vias 132 are formed down to the sacrificial material 118. Specifically, the vias 132 are formed through the dielectric layer 130, the membrane layer 126, and the thin dielectric layer 120. The vias 132 may be positioned such that they do not pass through any metal components of either the third metal layer 128 or the top electrode metal layer 122.

Figure 1F:
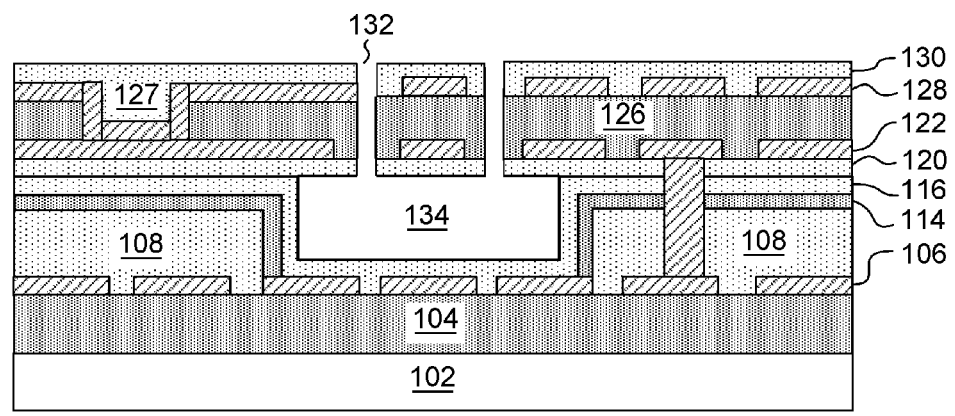

FIG. 1F illustrates the removal of the sacrificial material 118 to form the full sacrificial cavity 134. In one example, the sacrificial material may be etched away using xenon difluoride (XeF$_2$). XeF$_2$ can be used to etch away the amorphous silicon sacrificial material 118 through the vias 132. Other methods to removes the sacrificial material may be used as well. Various dry etching processes may be used. Dry etching involves ion bombardment to remove specific types of material.

The sacrificial material 118 and the material of the thin dielectric layers 116, 120 can be selected so that a particular etchant will remove only the sacrificial material 118 and not the dielectric material. Thus, after the etching process to remove the sacrificial material 118 is complete, the sacrificial cavity 134 will have dielectric layer material on each of the walls. The dielectric material essentially acts as a stop for the etching process that removes the sacrificial material 118.

Figure 1G:
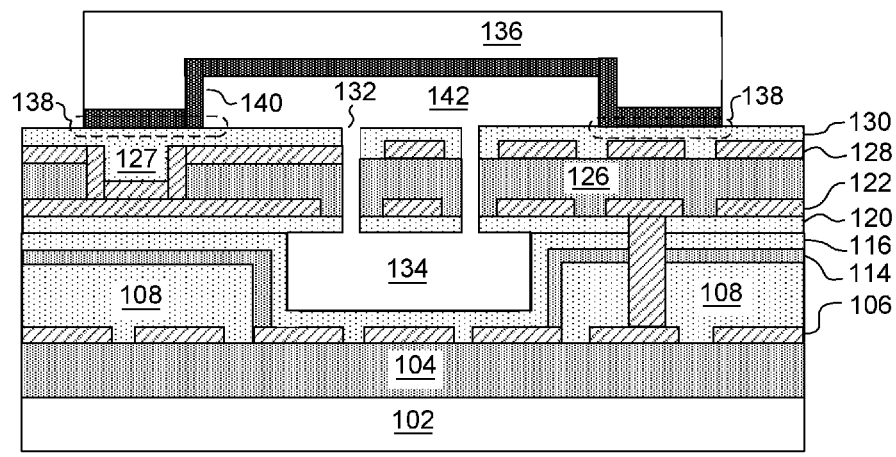

FIG. 1G illustrates the attachment of a capping substrate 136. According to the present example, a capping substrate 136 is used to create a second cavity. The capping substrate includes a dielectric layer 140 that is to become the capping structure. The capping substrate 136 is formed separately as will be described in the text accompanying FIG. 2. The capping substrate 136 includes a cavity such that when it is bonded to the top dielectric layer 130, an enclosed cavity 142 is formed.

The capping substrate 136 is bonded to the top dielectric layer 130 so as to form a fusion bond 138. A fusion bond 138 involves a thermal annealing process that fuses the capping substrate 136 where it makes contact with the top dielectric layer 130. The bond 138 is such that it seals off the second cavity 142. The second cavity 142 remains connected to the sacrificial cavity 134 through the vias 132. Using processes described herein, various MEMS devices may be formed within the two cavities 142,134. The formation of such devices is not shown. Rather, the figures illustrate the process of forming the substrates and circuitry that support the MEMS devices.

Figure 1H:
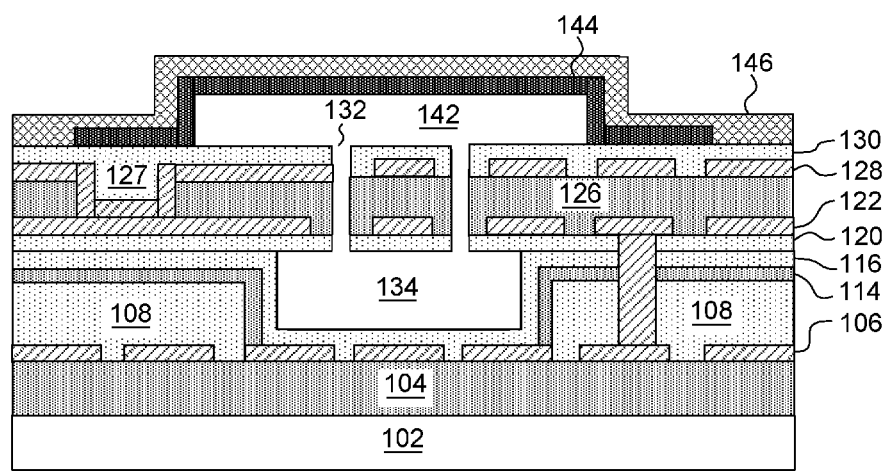

FIG. 1H illustrates the removal of the capping substrate 136. While the capping substrate 136 itself is removed, the dielectric layer 140 that was formed onto the capping substrate 136 remains to form the capping structure 144. The capping substrate 136 may be removed through a variety of processes. In one example, the capping substrate 136 is removed through a grinding process. In one example, the capping substrate 136 is removed using an etching process. The etching process may be selective to the capping substrate 136 material so that the dielectric material 140 remains intact to form the capping structure 144.

In some examples, an additional securing layer 146 may be deposited onto the capping structure 140. The securing layer 146 may be a polymer or other type of material that may be used to strengthen or secure the capping structure 146.

Figure 2A:
FIGS. 2A-2B are diagrams showing an illustrative process for forming a capping substrate that is used to form a capping structure, according to one example of principles described herein.
Figure 2B:
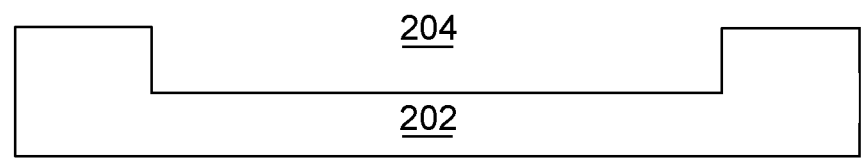

FIGS. 2A-2B are diagrams showing an illustrative process 200 for forming a capping substrate that is used to form a capping structure. FIG. 2A illustrates the capping substrate 202 alone. The capping substrate may be made of a semiconductor material such as silicon.

FIG. 2B illustrates the formation of a cavity 204 into the substrate 202. The cavity may be formed using standard photolithographic techniques. Specifically, a photo-resist layer may be deposited onto the substrate 202 and then exposed to a light source through a photo-mask. The region where the cavity 204 is to be formed are then developed away, exposing the substrate to an etching process that forms the cavity 204.

Figure 2C:
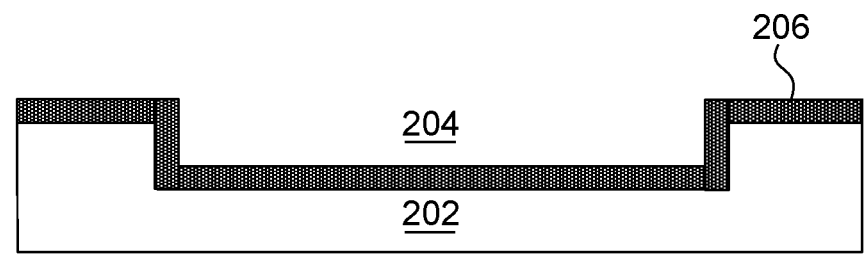
FIG. 2C illustrates the formation of a dielectric layer onto the capping substrate of FIGS. 2A and 2B.

FIG. 2C illustrates the formation of a dielectric layer 206 onto the substrate. To distinguish this dielectric layer 206, it may be referred to as the capping dielectric layer 206. The capping dielectric layer conforms to the shape of the cavity 204. Thus, the dielectric material is deposited on the sidewalls of the cavity 204 as well as the bottom of the cavity and the substrate 202. In one example, the capping dielectric layer 206 is formed using a thermal oxidation process.

Figure 3:
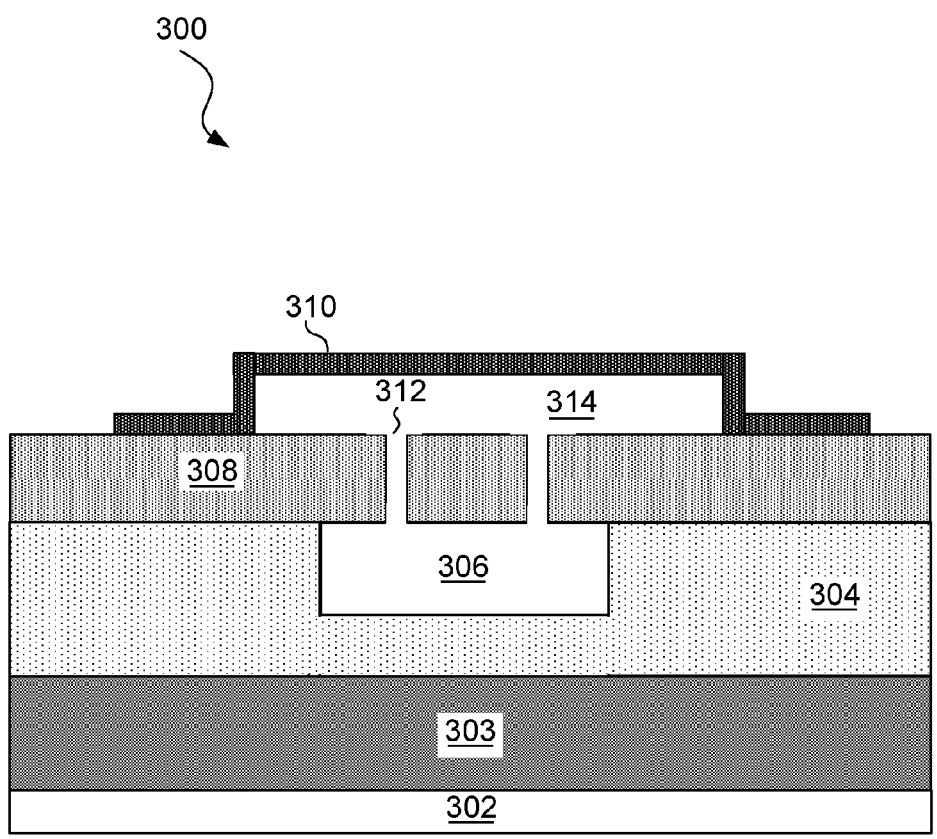
FIG. 3 is a diagram showing an illustrative MEMS device structure that includes a capping structure, according to one example of principles described herein.

FIG. 3 is a diagram showing an illustrative MEMS device structure 300 that includes a capping structure 310. The structure 300 illustrated in FIG. 3 is similar to the structure formed by the process illustrated in FIGS. 1A-1H. However, the structure in FIG. 3 shows only some key layers formed and does not necessarily illustrate all layers that may be formed within a MEMS device structure embodying principles described herein.

According to certain illustrative examples, the MEMS device structure 300 includes a dielectric layer 304 on top of a CMOS substrate 303. In some examples, the CMOS substrate may be disposed onto a standard substrate 302. The dielectric layer 304 has a sacrificial cavity 306 formed therein.

A membrane layer 308 is formed on top of the dielectric layer 304. A capping structure 310 is bonded to the top of the membrane layer 308. The capping structure 310 is bonded to the membrane layer 308 so as to form a second cavity 314. The sacrificial cavity 306 is connected to the second cavity 314 through a number of vias 312.

Figure 4:
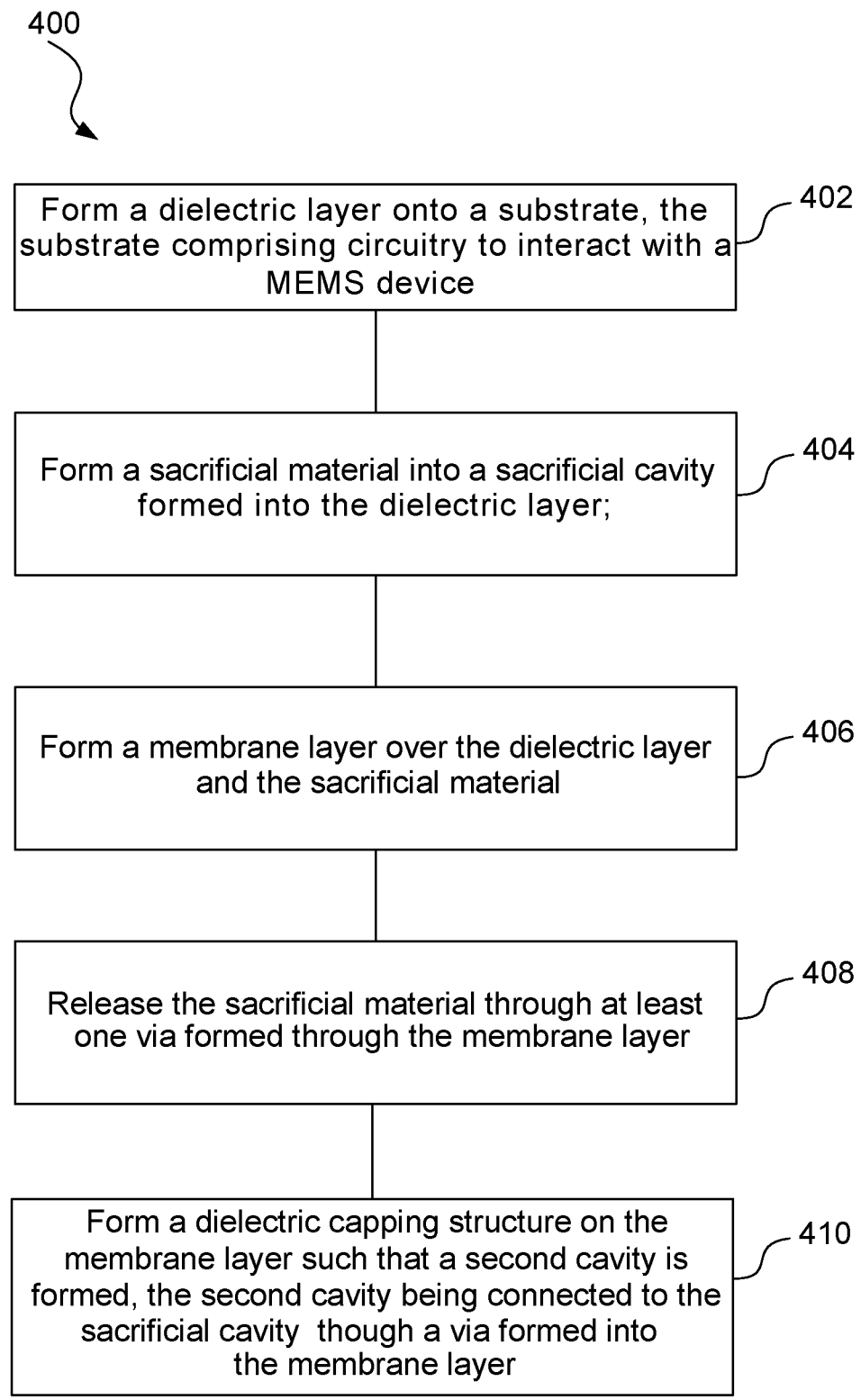
FIG. 4 is a flowchart showing an illustrative method for forming a MEMS device with a capping structure, according to one example of principles described herein.

FIG. 4 is a flowchart showing an illustrative method for forming a MEMS device with a capping substrate. According to certain illustrative examples, the method includes a step of forming 402 a dielectric layer onto a CMOS substrate. The method further includes a step of forming 404 a sacrificial material into a sacrificial cavity formed into the dielectric layer. The method further includes a step of forming 406 a membrane layer over the dielectric layer and sacrificial material. The method further includes a step of removing 408 the sacrificial material through at least one via formed through the membrane layer. The method further includes a step of forming 410 a capping structure on the membrane layer such that a second cavity is formed, the second cavity being connected to the sacrificial cavity through the at least one via formed into the membrane layer.

According to certain illustrative examples, a method for forming an integrated circuit device includes forming a dielectric layer over a substrate, the substrate comprising circuitry to interact with a Micro Electro-Mechanical System (MEMS) device, forming a sacrificial material into a sacrificial cavity formed into the dielectric layer, forming a membrane layer over the dielectric layer and sacrificial material, removing the sacrificial material through at least one via formed through the membrane layer, and forming a dielectric capping structure on the membrane layer such that a second cavity is formed, the second cavity being connected to the sacrificial cavity through the at least one via formed into the membrane layer.

According to certain illustrative examples, a method for forming an integrated circuit device includes forming a semiconductor substrate comprising circuitry to interact with a Micro Electro-Mechanical System (MEMS) device, forming a bottom electrode layer onto the semiconductor substrate, forming a dielectric layer onto the bottom electrode layer, forming a sacrificial material into a sacrificial cavity formed into the dielectric layer, forming a top electrode layer on the dielectric layer, forming a membrane layer over the top electrode layer, removing the sacrificial material through at least one via formed through the membrane layer, and forming a dielectric capping structure on the membrane layer such that a second cavity is formed, the second cavity being connected to the sacrificial cavity through the at least one via formed into the membrane layer.

According to certain illustrative examples, an integrated circuit device includes a dielectric layer disposed over a Complementary Metal-Oxide Semiconductor (CMOS) substrate, the CMOS substrate holding circuitry to interact with a MEMS device, the dielectric layer having a sacrificial cavity formed therein. The device further includes a top electrode layer on top of the sacrificial cavity, a bottom electrode layer on bottom of the sacrificial cavity, a membrane layer formed over the dielectric layer, the membrane layer having a via over the sacrificial cavity, and a capping structure comprising a dielectric material disposed over the membrane layer. A second cavity is disposed between the capping structure and the membrane layer, the second cavity being connected to the sacrificial cavity through the via in the membrane layer.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a first material layer over a substrate, wherein the material layer defines a first cavity;

forming a second material layer in the first cavity;
forming a membrane layer over the first material layer and the second material layer;
forming a via extending through the membrane layer;
removing the second material layer through the via;
bonding a capping substrate to the membrane layer, the capping substrate including a dielectric layer defining a second cavity, the second cavity in communication with the first cavity through the via; and
after bonding the capping substrate to the membrane layer, removing a portion of the capping substrate.

2. The method of claim 1, further comprising forming a Micro Electro-Mechanical System (MEMS) device within one of the first and second cavities.

3. The method of claim 1, further comprising forming another dielectric layer over the membrane layer, and
wherein bonding the capping substrate to the membrane layer includes bonding the dielectric layer to the another dielectric layer.

4. The method of claim 1, further comprising forming a metal layer on the substrate prior to forming the first material layer over the substrate.

5. The method of claim 4, further comprising forming another metal layer over the second material layer on the substrate; and
forming a conductive via feature to electrical couple the another metal layer to the metal layer prior to removing the second material layer through the via.

6. The method of claim 4, wherein a portion of the metal layer is disposed within the first cavity prior to forming the second material layer in the first cavity.

7. The method of claim 6, further comprising forming another dielectric layer in the first cavity over the metal layer prior to forming the second material layer in the first cavity.

8. A method comprising:
forming a first metal layer over a substrate;
forming an interlayer dielectric layer over the first metal layer, wherein the interlayer dielectric layer includes a first cavity;
forming a first dielectric layer over the first metal layer within the first cavity;
forming a sacrificial layer within the first cavity;
forming a second metal layer over the sacrificial layer;
forming a conductive via feature within the interlayer dielectric layer to electrically couple the first metal layer to the second metal layer;
forming a membrane layer over the sacrificial layer;
forming a via that extends completely through the membrane layer;
removing the sacrificial layer through the via; and
forming a capping structure over the membrane layer such that a second cavity is formed, the second cavity being connected to the sacrificial cavity through the via.

9. The method of claim 8, wherein the capping structure includes a semiconductor substrate and a dielectric layer disposed on the semiconductor substrate.

10. The method of claim 9, further comprising forming another dielectric layer over the membrane layer, and
wherein forming the capping structure over the membrane layer includes bonding the dielectric layer to the another dielectric layer.

11. The method of claim 10, further comprising removing the semiconductor substrate while leaving the dielectric layer over the membrane layer.

12. The method of claim 11, further comprising forming a securing layer over the dielectric layer after removing the semiconductor substrate, wherein the sealing layer physically contacts the dielectric layer and the another dielectric layer.

13. The method of claim 12, wherein the securing layer includes a polymer material.

14. The method of claim 8, further comprising forming a third metal layer directly on the membrane layer, wherein the third metal layer is electrically coupled to the second metal layer.

15. A method comprising:
forming a first metal layer over a substrate;
forming an interlayer dielectric layer over the first metal layer, wherein the interlayer dielectric layer includes a first cavity;
forming a first dielectric layer over the first metal layer within the first cavity;
forming a sacrificial layer within the first cavity;
forming a second metal layer over the sacrificial layer;
forming a membrane layer over the sacrificial layer;
forming a via that extends through the membrane layer;
removing the sacrificial layer through the via;
bonding a dielectric layer on a surface of a semiconductor substrate to the membrane layer, the dielectric layer defining a second cavity; and
after bonding the dielectric layer on the surface of the semiconductor substrate to the membrane layer, removing at least a portion of the semiconductor substrate.

16. The method of claim 15, wherein removing at least the portion of the semiconductor substrate exposes a portion of the dielectric layer.

17. The method of claim 16, further comprising forming a polymer layer directly on the exposed portion of the dielectric layer.

18. The method of claim 15, forming a conductive via feature within the interlayer dielectric layer to electrically couple the first metal layer to the second metal layer.

19. The method of claim 15, further comprising forming a Micro Electro-Mechanical System (MEMS) device within the first and second cavities.

20. The method of claim 15, wherein removing the sacrificial layer through the via includes performing a dry etching process to remove the sacrificial layer, and
wherein the sacrificial layer includes amorphous silicon.

* * * * *